United States Patent [19]

Yu et al.

[11] Patent Number: 5,380,678

[45] Date of Patent: Jan. 10, 1995

[54] BILAYER BARRIER METAL METHOD FOR OBTAINING 100% STEP-COVERAGE IN CONTACT VIAS WITHOUT JUNCTION DEGRADATION

[76] Inventors: Chang Yu, 2801 Stewart Ave., Boise, Id. 83702; Trung T. Doan, 1574 Shenandoah Dr., Boise, Id. 83712

[21] Appl. No.: 667,955

[22] Filed: Mar. 12, 1991

[51] Int. Cl.⁶ .................. H01L 21/441; H01L 21/324
[52] U.S. Cl. ................................ 437/190; 437/174; 437/192; 437/247
[58] Field of Search ............... 437/192, 200, 247, 190, 437/174

[56] References Cited

U.S. PATENT DOCUMENTS

| | | | |
|---|---|---|---|
| 4,740,485 | 4/1988 | Sharpe-Geisler | 437/245 |
| 4,784,973 | 11/1988 | Stevens et al. | 437/200 |
| 4,882,293 | 11/1989 | Naumann et al. | 437/192 X |
| 5,070,036 | 12/1991 | Stevens | 437/192 X |

OTHER PUBLICATIONS

Wolf S. "Silicon Processing for the VLSI Era" vol. 2, Lattice Press Sunset Beach Calif., p. 128 1990 (no month).

Wolf, S. "Silicon Processing for the VLSI Era", vol. 2, Lattice Press, Sunset Beach, Calif. pp. 255-256, 1990 (no month).

*Primary Examiner*—John S. Maples
*Attorney, Agent, or Firm*—Limbach & Limbach

[57] ABSTRACT

A process for forming an electrical connection in a semiconductor device between an aluminum interconnect and the substrate avoids junction spiking at temperatures (1000° C.–1500° C.) significantly above the standard semiconductor device fabrication temperatures (<500° C.). An insulating layer is formed over an upper surface of the substrate with a via formed through the insulating layer to expose a portion of the substrate to which electrical connection is to be made. A first refractory metal barrier layer is formed over the insulating layer and the exposed portion of the substrate. Preferably, the first barrier layer is TiN. A second refractory metal barrier layer is formed over the first barrier layer to provide extra thickness and to cap the first barrier layer to minimize the gas emission and enhanced optical ablation due to the first barrier layer during laser planarization, and to provide a wetting layer during and produce a desirable surface morphology after laser planarization. The second layer is preferably Ti. A metal interconnect layer is formed following the deposition of the second barrier layer without breaking vacuum. The metal interconnect layer is preferably aluminum or its alloys. The aluminum layer is annealed above the melting point of the interconnect metal in a very short time to planarize the aluminum and to flow the aluminum to fill any voids. The aluminum and barrier layers are etched to form an appropriate interconnect pattern.

14 Claims, 2 Drawing Sheets

BILAYER BARRIER METAL METHOD FOR OBTAINING 100% STEP-COVERAGE IN CONTACT VIAS WITHOUT JUNCTION DEGRADATION

FIELD OF THE INVENTION

This invention relates to the field of semiconductor processing. More particularly, this invention relates to a barrier layer scheme for contact/via filling at unusually high temperatures by laser planarization without junction degradation.

BACKGROUND OF THE INVENTION

Using a metal to form a connection to silicon can cause manufacturing, quality or reliability problems. Thick layers of metal are needed to achieve the low impedance necessary for desired circuit performance. However, thick layers of many metals are difficult to etch for forming a desired interconnect pattern. For this reason, aluminum is a highly desirable metal to use in semiconductor processing because it is easy to etch into desired patterns. Unfortunately, aluminum and silicon are particularly attractive to one another so that the silicon atoms will diffuse into aluminum, leaving voids in the silicon substrate. Aluminum atoms will next fill these voids, forming spikes of aluminum which destroys the aluminum to silicon junction, i.e. silicon is soluble in aluminum and has a solubility of approximately 0.5 atomic percentage at 450° C.

A variety of techniques have been used to overcome this junction spiking problem. One technique to avoid junction spiking includes applying a barrier metal between the substrate and the aluminum layer that is not reactive to or soluble in either silicon and aluminum. In other words, a thin layer of the barrier metal is deposited and then covered with a thicker layer of aluminum. The thin layer of the barrier metal prevents the aluminum from spiking into the underlying silicon. The thick aluminum provides a sufficiently low impedance current carrying path to achieve desired performance criteria. While barrier metals are more difficult to etch than aluminum, they are typically thin by comparison so that etching problems are minimized. Titanium nitride (TiN) is a commonly used barrier metal.

As processing technology has advanced to provide thinner lines for greater circuit density, the aspect ratio of contact vias (the ratio of via depth to the diameter of the opening) has correspondingly increased. Because of the small geometries and the aspect ratio of the contact holes, it becomes increasingly difficult to simply fill contact vias by conventional physical deposition techniques such as vacuum evaporation and sputtering. As a result voids are formed in the holes. These voids can either form an open circuit, increase the impedance of the contact or cause a reliability problem such as low electromigration lifetime due to metal migration through a narrow current path.

To solve this problem, engineers have heated the wafer, such as with a laser, to melt the aluminum and allow it to flow to completely fill the contact via. Although this technique has been demonstrated successfully in filling a submicron, high aspect ratio contact/via, damage to the junction integraty during laser processing has been observed by the inventors. The degradation in the device junction is caused by a breakdown in the barrier layer which allows rapid silicon diffusion into the Aluminium alloy, and a resultant aluminum spike formation at laser processing temperatures as high as 1000° C.-1700° C. Therefore, the standard barrier schemes, which involve a single layer of barrier metal such as titanium nitride and titanium tungsten of thickness ~1K Å, are not adequate in preventing junction spiking in a laser planarization process.

A semiconductor process is needed which completely fills contact vias in high aspect ratio small geometry devices and does not allow the formation of metal to semiconductor junction spikes or damage an intermediate barrier metal layer at processing temperatures as high as 1000° C. or above.

SUMMARY OF THE INVENTION

A bilayer barrier layer is described specifically for contact filling using laser planarization. In addition to the conventional requirement for a barrier layer to prevent interdiffusion between aluminum and silicon and to avoid formation of spikes at the standard device fabrication temperatures of 300° C. to 400° C., the proposed bilayer barrier layer should be effective to prevent junction spikes from forming at a temperature in excess of 1000° C.-1500° C. and a heating duration on the order of 100 nanoseconds to 100 microseconds. This new barrier scheme should also meet the following requirements:

(A) Provide a suitable wetting layer for the molten aluminum or aluminum alloys during a laser planarization process.

(B) Result in a best possible surface morphology for aluminum/barrier layer composite after laser planarization.

(C) Minimize the gas emission and optical ablation from the barrier layer during laser processing.

An insulating layer is formed over an upper surface of the substrate with a via formed through the insulating layer to expose a portion of the substrate to which electrical connection is to be made. A first conductive barrier layer is formed over the insulating layer and the exposed portion of the substrate. The first barrier layer is a refractory metal which does not allow the diffusion of silicon atoms into it. Preferably, the first barrier layer is TiN.

A second conductive barrier layer is formed over the first barrier layer to provide extra thickness, to cap the first barrier layer and to provide a wetting layer for molten aluminum during laser planarization. The second barrier layer is a refractory metal which has a low solubility in aluminum. The second layer is preferably titanium (Ti). A metal interconnect layer is formed over the surface of the capping second barrier layer. The metal interconnect layer is preferably aluminum and is formed without breaking the vacuum used during the formation of the second barrier layer. The aluminum layer is annealed to planarize the aluminum and to flow the aluminum to fill any voids. The aluminum and barrier layers are etched to form an appropriate interconnect pattern.

DETAILED DESCRIPTION OF THE PREFERRED EMBODIMENT

Figure 1:
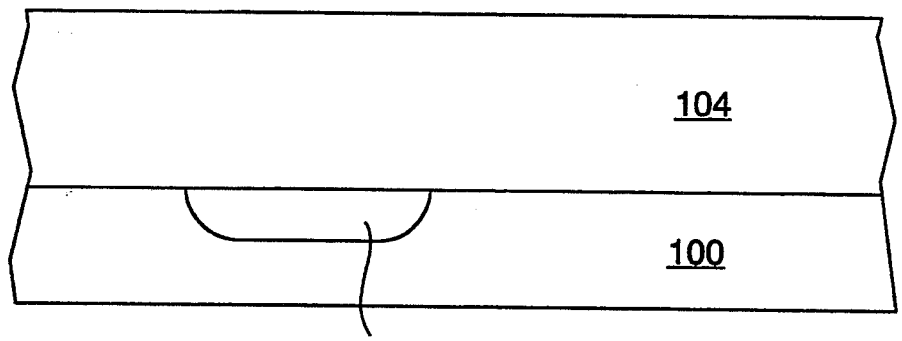
FIGS. 1-7 show cross-sections of a portion of a semiconductor wafer during processing according to the preferred embodiment of the present invention.

A semiconductor wafer 100 has previously been subjected to a sequence of manufacturing steps to form portions of electronic circuits is shown in FIG. 1. Those portions of circuits can be formed by any known techniques and are not described here. A single conductive diffusion region 102 is shown within the wafer 100. An insulation layer 104 is formed over an upper surface of the wafer 100 using known techniques. Preferably, the insulating layer is formed of borophosphosilicate glass (BPSG).

Figure 2:
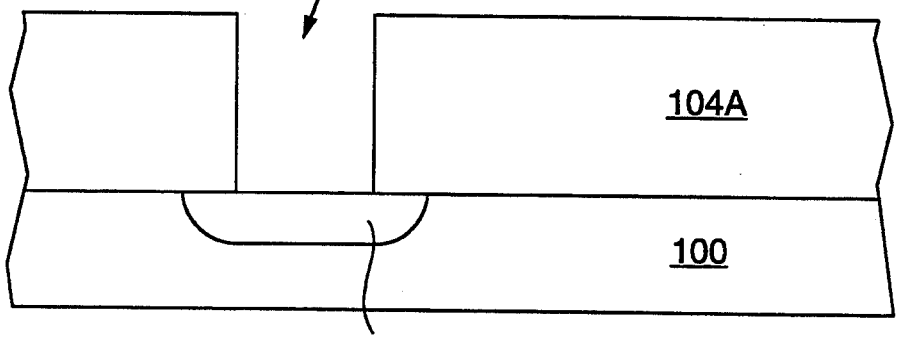

Interconnecting metal traces that overlie the insulating layer 104 are formed next. It is desired that the metal layer make an electrical contact to the diffusion region 102. FIG. 2 shows that a via 106 is formed through the insulating layer 104 to expose a portion of the diffusion region 102. The via is formed by known masking and etching techniques. The reference numeral for the insulating layer is now 104A to indicate that the layer has been changed.

Figure 3:
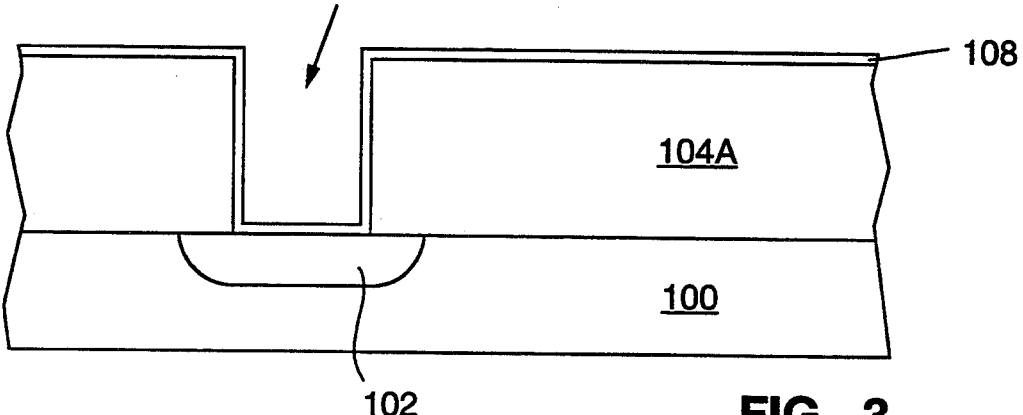
Figure 4:
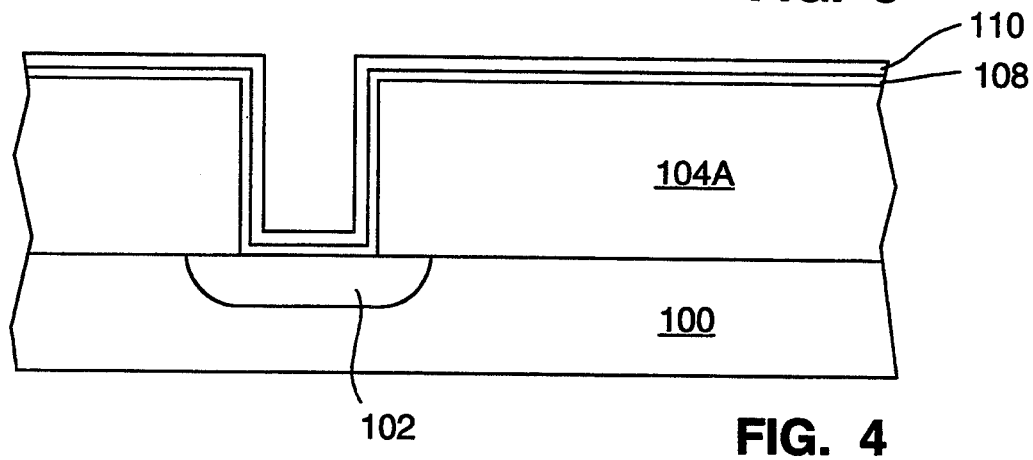

A double layer barrier metal is deposited next. Conventional barrier metal layers are typically 1000 Å, or less. In contrast, in the present invention, a first conductive barrier layer 108 is deposited as shown in FIG. 3 over the surface of the wafer and into the via hole 106. This first barrier layer is preferably between 500 and 1000 Å. The first barrier layer is also preferably the refractory metal TiN. The TiN layer 108 can either be deposited as a reactive TiN film by sputtering or by depositing the titanium film by sputtering and then subjecting it to a rapid thermal anneal (RTA) in a nitrogen atmosphere.

TiN layer will tend to enhance the optical ablation due to the nitrogen in the TiN layer and other gases incorporated during the rapid thermal anneal (for RTA TIN). So, a second conductive barrier layer 110 will be deposited over the first barrier layer 108 to cap the nitrogen into the first layer. The second barrier layer 110 is preferably between 500 and 2,000 Å thick and is preferably formed of the refractory metal Ti. It is also preferable that this second layer be deposited within a half an hour to avoid any oxidation of the underlying TiN layer.

The second barrier also improves the junction integrity as a sacrificial layer and acts as a wetting interface between the first barrier layer and the overlying interconnect metal described below. Experiments have shown successful results using Ti, reactive TiN and TiW as the second barrier layer 110.

Figure 5:
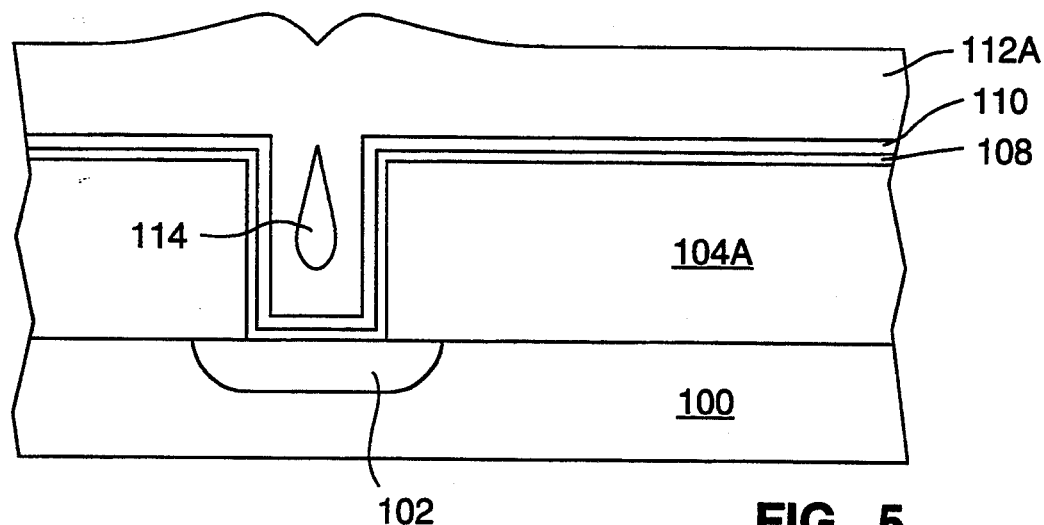
Figure 6:
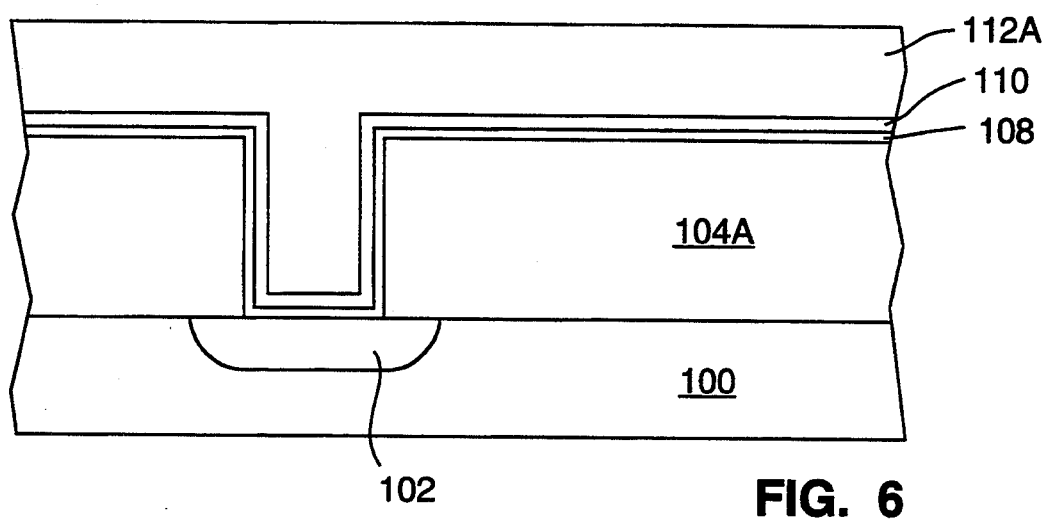

FIG. 5 shows the interconnect metal 112. In the preferred embodiment, the metal layer 112 is deposited without breaking the vacuum used during the formation of the second barrier layer 110. Because of the high aspect ratio of the via 106, i.e., the height to diameter ratio, as the interconnect layer is deposited a void 114 may be formed in the via. The metal layer 112 is annealed above the melting point of the interconnect metal in FIG. 6 to planarize the upper surface of the structure. The reference numeral 112A indicates that the metal layer has changed. During anneal, the molten metal flows into the contact via and results in a void-free contact filling. The anneal step is preferably done with a laser.

During the laser planarization, the laser is rastered to cover the entire wafer. The laser covers an approximately three millimeter square pattern with a 25 nanosecond pulse duration.

Figure 7:
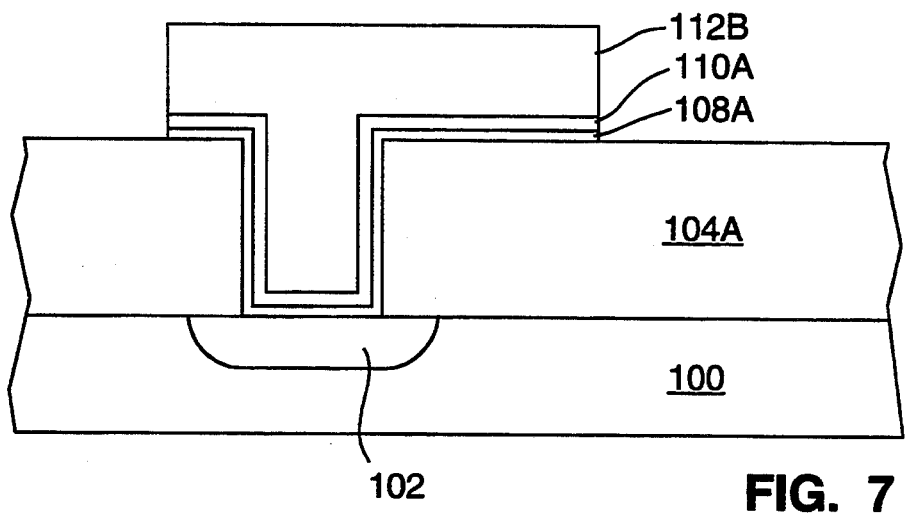

The metal interconnect layer and both barrier layers are typically etched to form a desired interconnect structure as shown in FIG. 7. The reference numerals are appended with alphabet characters to indicate the structures have changed, The experiments have been carried out by the inventors to test the effectiveness of this new bilayer barrier metal scheme. Both test and device wafers were used for this purpose. The contact filling process involves: (1) first sputter a layer of AL Si(1%) Cu (0.5%) on patterned wafers and (2) rapidly melt the sputtered metal layer and flow the metal into the voids in the contacts by the laser planarization process. The laser planarization process was carried out by a pulsed XeCl excimer laser of a wavelength 308 nm and pulse duration approximately 25 ns.

The device junction integraty after laser processing was examined by electrical measurements. High junction leakage current was observed for wafers using the standard barrier scheme (for example, 500 Å Reactive titanium nitride). However, no damage to junction integraty was found for device wafers adapting the bilayer barrier metal method. In addition, a better surface morphology and reduced ablation was obtained by using this new barrier scheme.

What is claimed is:

1. A process for forming an electrical connection to a semiconductor layer that is exposed through a via in an overlying insulating layer having substantially vertical sidewalls comprising the steps of:
    a) forming a first conductive barrier layer over the exposed semiconductor layer and on the walls of the via wherein the first barrier layer has a low solubility in the semiconductor layer;
    b) forming a second barrier layer consisting of Ti over the first barrier layer;
    c) forming a metal layer over the second barrier layer; and
    d) annealing the metal layer to a sufficiently high temperature to melt the metal layer.

2. The method according to claim 1 wherein the second barrier layer is deposited in a vacuum and the metal layer is deposited without breaking the vacuum used to form the second barrier layer.

3. The method according to claim 1 wherein the first barrier layer is a refractory metal.

4. The method according to claim 3 wherein the refractory metal is TiN.

5. The method according to claim 3 wherein the refractory metal is TiW.

6. The method according to claim 3 wherein the refractory metal is reactive TiN.

7. The method according to claim 3 wherein the first barrier layer is between 500 and 1000 Å thick.

8. The method according to claim 1 wherein the second barrier layer is 500 to 2000 Å thick.

9. The method according to claim 8 wherein the the first layer is TiN.

10. The method according to claim 8 wherein the first layer is TiW.

11. The method according to claim 1 wherein the metal layer is aluminum.

12. A process for forming an electrical connection in a semiconductor device having a semiconductor substrate between an overlying aluminum interconnect layer and the substrate comprising the steps of:

a) forming an insulating layer over an upper surface of the substrate;
b) forming a via through the insulating layer to expose a portion of the substrate, with the via having substantially vertical sidewalls;
c) forming a TiN layer over the insulating layer and the exposed portion of the substrate;
d) forming a layer consisting of Ti over the TiN layer;
e) forming an aluminum layer over the Ti layer; and
f) annealing the aluminum layer to the aluminum layer melting point.

13. The method according to claim 12 wherein the step of forming a TiN layer comprises the steps of sputtering Ti and then performing a rapid thermal anneal in a nitrogen atmosphere.

14. The method according to claim 12 wherein the step of forming the TiN layer comprises the steps of depositing reactive TiN by sputtering.

* * * * *